(12) United States Patent
Tanaka et al.

(10) Patent No.: US 7,242,433 B2
(45) Date of Patent: Jul. 10, 2007

(54) SMALL-SIZED IMAGE PICKUP DEVICE HAVING A SOLID-STATE IMAGE PICKUP ELEMENT AND A LENS HOLDER MOUNTED ON OPPOSITE SIDES OF A TRANSPARENT SUBSTRATE

(75) Inventors: Fujio Tanaka, Nara (JP); Masao Nakamura, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 868 days.

(21) Appl. No.: 10/061,645

(22) Filed: Feb. 1, 2002

(65) Prior Publication Data

US 2003/0128442 A1 Jul. 10, 2003

(30) Foreign Application Priority Data

Feb. 2, 2001 (JP) .............................. 2001-026953

(51) Int. Cl.
*H04N 5/225* (2006.01)
*G02B 13/16* (2006.01)
*G02B 7/02* (2006.01)

(52) U.S. Cl. ........................ 348/340; 348/335; 359/819

(58) Field of Classification Search ........... 348/207.99, 348/335, 340, 294, 311, 373–375; 359/819, 359/811, 821, 808, 809
See application file for complete search history.

(56) References Cited

U.S. PATENT DOCUMENTS

| | | | | |
|---|---|---|---|---|
| 4,896,217 A | * | 1/1990 | Miyazawa et al. | .......... 348/340 |
| 5,040,069 A | * | 8/1991 | Matsumoto et al. | .......... 348/76 |
| 5,418,566 A | * | 5/1995 | Kameishi | ..................... 348/294 |
| 5,673,083 A | * | 9/1997 | Izumi et al. | ................. 348/340 |
| 6,266,197 B1 | * | 7/2001 | Glenn et al. | ................. 359/819 |
| 6,483,652 B2 | * | 11/2002 | Nakamura | ................... 359/819 |
| 6,518,656 B1 | * | 2/2003 | Nakayama et al. | ......... 257/680 |
| 6,768,516 B2 | * | 7/2004 | Yamada et al. | ............. 348/340 |
| 6,795,120 B2 | * | 9/2004 | Takagi et al. | ............... 348/294 |
| 2001/0055073 A1 | * | 12/2001 | Shinomiya | ................... 348/374 |
| 2005/0104994 A1 | * | 5/2005 | Hoshino et al. | ............ 348/340 |

FOREIGN PATENT DOCUMENTS

| | | |
|---|---|---|
| JP | 04-286159 | 10/1992 |
| JP | 9284617 | 10/1997 |
| JP | 10-032323 | 2/1998 |

* cited by examiner

*Primary Examiner*—David Ometz
*Assistant Examiner*—Kelly Jerabek
(74) *Attorney, Agent, or Firm*—David G. Conlon; William J. Daley, Jr.; Edwards Angell Palmer & Dodge LLP (57) ABSTRACT

In a process of producing an image pickup device, a solid-state image pickup element is joined to a transparent substrate, with its light-receiving surface opposed to the transparent substrate, and sealed with a thermosetting resin. A peripheral IC chip is bonded to a surface of the image pickup element opposite from the light-receiving surface. The image pickup element and peripheral IC chip are inserted into a through hole of a printed circuit board, and the transparent substrate is connected to the printed circuit board, which is then connected to the peripheral IC chip through wires. The wires, the image pickup element and the peripheral IC chip are sealed with a coat resin. A lens holder is fitted to the printed circuit board and a surface of the transparent substrate opposed from the surface joined with the image pickup element, using side surfaces of the transparent substrate as reference planes.

10 Claims, 11 Drawing Sheets

SMALL-SIZED IMAGE PICKUP DEVICE HAVING A SOLID-STATE IMAGE PICKUP ELEMENT AND A LENS HOLDER MOUNTED ON OPPOSITE SIDES OF A TRANSPARENT SUBSTRATE

BACKGROUND OF THE INVENTION

The present invention relates to an image pickup device which is reduced in size and thickness by integrally assembling an optical lens, a solid-state image pickup element, peripheral components, a substrate and so on, and a process for producing the same.

Image pickup devices which have a size similar to that of video cameras have hitherto been common. However, it is desired that these devices be mounted on household electric appliances in information fields, and thus such devices as are highly functional and reduced in size and thickness are demanded.

Figure 28:
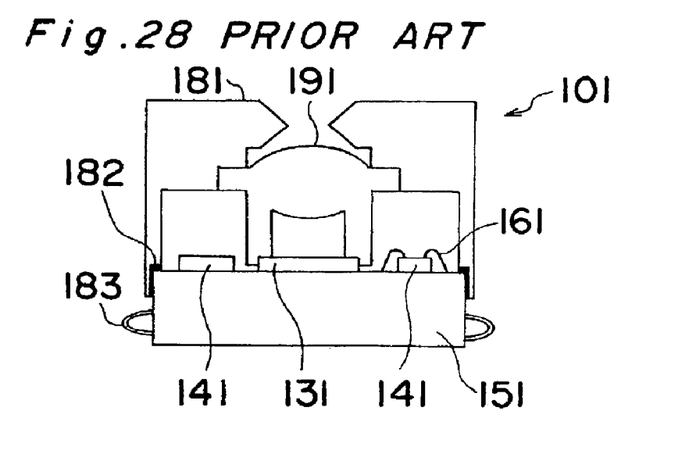
FIG. 28 is a schematic constitution view of a conventional image pickup device.
Figure 29:
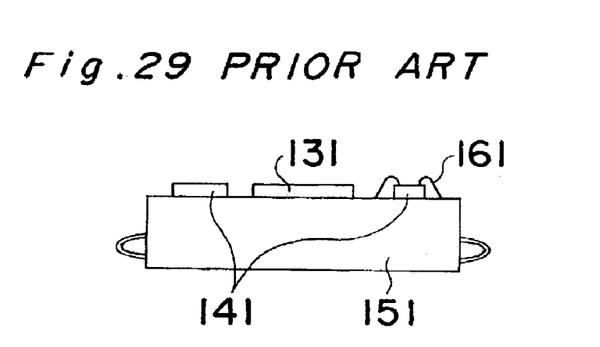
FIG. 29 is a diagram showing an assembling stage of the conventional image pickup device.
Figure 30:
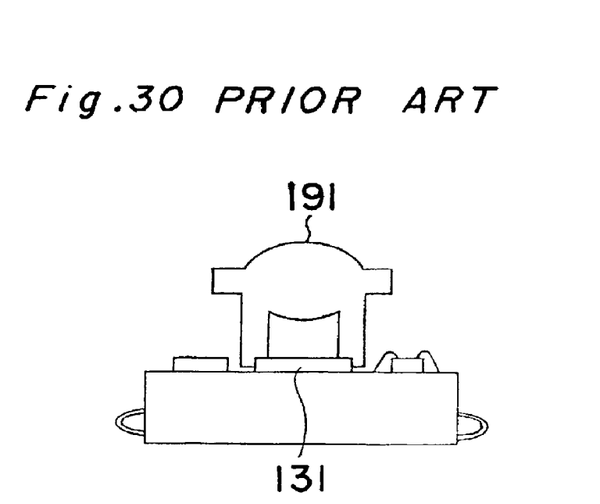
FIG. 30 is a diagram showing another assembling stage of the conventional image pickup device.

In Japanese Patent Publication JP-A-9-284617, a technology related to the reduction in the size and thickness of the image pickup device is disclosed. FIG. 28 is a schematic diagram of an image pickup device disclosed in this Publication. FIGS. 29 and 30 are diagrams showing an assembling process of the conventional image pickup device. This image pickup device 101 is produced as follows: First, a die bond material is applied to a substrate 151. After a solid-state image pickup element 131 and peripheral ICs 141 are mounted on the substrate by die bonding, connection wires 161 are provided by wire bonding, whereby a state shown in FIG. 29 is attained. Next, a lens 191 is fitted to the solid-state image pickup element 131, whereby a state shown in FIG. 30 is attained. Furthermore, a holder 181 is fitted to the substrate with a filler or sealer 182 to thereby complete the image pickup device 101 as shown in FIG. 28. The reference numeral 183 indicates a lead.

In the prior art disclosed in the Japanese Patent Publication JP-A-9-284617, a solid-state image pickup element (bare chip) is mounted on a substrate, and ICs as peripheral circuits are disposed on the periphery of the solid-state image pickup element, whereby the miniaturization and thinning of the image pickup device is contrived. Although this method is advantageous when thinning the image pickup element, it is required to secure a region for mounting the peripheral IC chips, which are mounted on the periphery of the solid-state image pickup element. Further, as the function of the image pickup device becomes higher, the number of components to be mounted increases. Thus, it has been difficult to miniaturize the image pickup device. Furthermore, since a lens is fitted to the solid-state image pickup element (bare chip) that has been mounted, while a holder is fitted to the substrate with the filler, a highly precise alignment technique has been required when the holder is aligned with the lens. If this alignment is inappropriate, sufficient hermetic sealing of the bare chip cannot be performed, resulting in a problem in that reliability of the image pickup device deteriorates.

SUMMARY OF THE INVENTION

The present invention was made in order to solve the above problems, and an object thereof is to provide an image pickup device which is easy in assembling, superior in mass productivity, highly functional, and which is miniaturized and thinned, and a process for producing the same.

In order to accomplish the above object, the present invention provides an image pickup device, comprising:

a solid-state image pickup element having a light-receiving surface;

a peripheral IC chip processing a signal output from the solid-state image pickup device;

a lens holder to which an optical lens is fittable;

a printed circuit board to which the lens holder is fixed; and a transparent substrate made of a material that transmits visible light or a material that has been subjected to optical filter treatment and is capable of transmitting visible light, said transparent substrate having wirings on at least a surface thereof, said image pickup element being sealed with a sealant in a state where the solid-state image pickup element is joined to the wirings on the surface of the transparent substrate, with the light-receiving surface of the solid-state image pickup element opposed to the transparent substrate leaving a predetermined gap therebetween, and the lens holder being fitted to a surface of the transparent substrate opposite from said surface to which the solid-state image pickup element is joined.

This constitution makes it possible to achieve image formation on the light-receiving surface of the solid-state image pickup element through the transparent substrate by the optical lens. When the transparent substrate subjected to optical filter treatment is used, it is not required to newly fit an optical filter to the image pickup device. Furthermore, since the solid-state image pickup element is sealed with the first sealant, foreign matters such as dust is prevented from entering the light-receiving region, which makes it possible to improve the reliability of the image pickup device.

In one embodiment, the peripheral IC chip is bonded to a rear surface of the solid-state image pickup element opposite from the light-receiving surface with the first sealant.

With this arrangement, a plurality of devices including the solid-state image pickup element and the peripheral IC chip are mounted on the transparent substrate in a stacked manner and without directly mounting the peripheral IC chip on the transparent substrate, the plurality of devices occupying a chip mounting area for one IC chip only. Thus, it is possible to reduce the substrate area. Further, this also makes it possible to bond the peripheral IC chip to the solid-state image pickup element without applying an adhesive.

In one embodiment, the printed circuit board is provided with a through hole;

the wirings of the transparent substrate that are joined to the solid-state image pickup element are connected to the printed circuit board through a first metal material in a state where the solid-state image pickup element joined to the transparent substrate and the peripheral IC chip bonded to the solid-state image pickup element are received in the through hole of the printed circuit board;

the peripheral IC chip is connected to the printed circuit board through a second metal material; and the solid-state image pickup element, the peripheral IC chip and the second metal material, which are received in the through hole of the printed circuit board, are sealed with a second sealant.

In this constitution, after the wirings formed on the transparent substrate are connected to the printed circuit board through the first metal material, the solid-state image pickup element, the peripheral IC chip and the second metal material through which the peripheral IC chip is connected to the printed circuit board are sealed with the second sealant. Thus, it is possible to apply the second sealant without using any particular jigs. Further, the solid-state image pickup element is sealed with the first and second sealants, while the peripheral IC chip and the second metal material that connects the peripheral IC chip to the printed circuit board are sealed with the second sealant. Thus, the reliability of the image pickup device is improved. Furthermore, the wirings to which the solid-state image pickup element is bonded and the printed circuit board are connected with the first metal material in a state where the solid-state image pickup joined to the transparent substrate and the peripheral IC chip bonded to the solid-state image pickup element are received in the through hole of the printed circuit board. Thus, thinning of the image pickup device is possible.

In one embodiment, the wirings of the transparent substrate are two layer-structured wirings which comprise either an insulating layer or an undercoat metal layer formed on said surface except for a region corresponding to a light-receiving region of the solid image pickup device, and a third metal material layer on the insulating layer or the undercoat metal layer.

This arrangement makes it possible to improve the adhesion between the wirings and the substrate, which makes it possible to secure alloyed junction strength of bump electrodes in forming the bump electrodes of the first metal material on the wirings.

In one embodiment, the wirings of the transparent substrate include electrode terminals for connection with the solid-state image pickup element, external input/output electrode terminals provided in proximity to a perimeter of the transparent substrate, and recognition marks for positioning which are provided in proximity to the external input/output electrode terminals.

In this constitution, it is possible to utilize the recognition marks when forming the bump electrodes on the electrode terminals for the connection with the solid-state image pickup element and the external input/output electrode terminals, when mounting the solid-state image pickup element on the transparent substrate, when mounting the peripheral IC chip and/or when mounting the transparent substrate on the printed circuit board. This improves the mounting precision.

In one embodiment, the printed circuit board has a spot-facing portion around the through hole on its rear surface which is opposite from the surface at which the printed circuit board is connected to the wirings of the transparent substrate, and the spot-facing portion is provided with terminals to which the second metal material is connected.

This arrangement makes it possible to surely seal the solid-state image pickup element, the peripheral IC chip and the second metal materials which have been inserted into the through hole formed in the printed circuit board, with the second sealant. Further, the through hole formed in the printed circuit board can serve as a dam preventing the second sealant from flowing outside.

In one embodiment, the printed circuit board comprises a hard substrate and a flexible board bonded together, each of which has a through hole, and the through holes of the hard substrate and the flexible board have different opening areas such that the spot-facing portion is provided.

In this embodiment, the spot-facing portion is formed by bonding the hard substrate and the flexible board together. Thus it is easy to achieve a spot-facing portion having a desired cross sectional shape.

In one embodiment, the lens holder has a two-stepped spot-facing portion at a surface at which the lens holder is fitted to the transparent substrate, and the lens holder is joined to the printed circuit board and the transparent substrate with an adhesive.

With this arrangement, when a first step of the two-stepped spot-facing portion of the lens holder and the transparent substrate are bonded with an adhesive, a second step of the two-stepped spot-facing portion can be used as an escape of the adhesive.

In one embodiment, the lens holder is fitted to the transparent substrate and the printed circuit board, using side surfaces of the transparent substrate as reference planes.

In this case, the lens holder is mounted to the transparent substrate and the printed circuit board with high precision without using a highly precise aligning technique.

In one embodiment, the peripheral IC chip is capable of carrying another peripheral IC chip on a surface opposite from the surface bonded to the solid-state image pickup element. Accordingly, even if the number of components to be used increases in order to make the image pickup device highly functional, it is not required to increase the substrate area, and hence, the size of the image pickup device.

The present invention also provides a process for producing an image pickup device wherein a transparent substrate mounted with a solid-state image pickup element and a peripheral IC chip processing a signal output from the solid-state image pickup element, a lens holder to which an optical lens is fittable, and a printed circuit board are joined together, said transparent substrate being made of a material transmitting visible light or a material subjected to optical filter treatment and capable of transmitting visible light, the process comprising the steps of:
forming bump electrodes on a plurality of electric signal input/output terminals included in wirings formed on one surface of the transparent substrate, and
mounting the solid-state image pickup element, with its light-receiving surface opposed to the transparent substrate, on the surface of the transparent substrate formed with the bump electrodes to join the solid-state image pickup element with the transparent substrate.

In this process, since the solid-state image pickup element having no bump electrodes is mounted on the transparent substrate formed with the bump electrodes by facedown bonding, it becomes possible to mount and join the solid-state image pickup element to the transparent substrate, without the occurrence of adhesion of foreign matter to the light-receiving surface of the solid-state image pickup element. Even if the foreign matter adheres to the transparent substrate, there are less concave and convex portions on the surface of the transparent substrate, compared with the surface of the solid-state image pickup element. Therefore, it is possible to remove the adhered foreign matter easily by washing.

In one embodiment, the solid-state image pickup element is joined to the wirings of the transparent substrate by an ultrasonic bonding method. When the wirings of the transparent substrate are formed from a metal material having a high diffusion coefficient, it is possible to perform bonding at a low temperature of about 120° C. at the most. Further, only by the application of an ultrasonic wave, an alloy is formed to complete bonding. Therefore, it is possible to attain a significant throughput performance.

In one embodiment, after the step of mounting the solid-state image pickup element, the process comprises the steps of:
applying a sealant to the periphery of the solid-state image pickup element mounted on the transparent substrate so as to seal the image pickup element;

mounting the peripheral IC chip on a surface of the solid-state image pickup element opposite from the light-receiving surface via said sealant to thereby join the peripheral IC with the solid-state image pickup element; and curing the sealant.

In this case, both the solid-state image pickup element and the peripheral IC chip are mounted in a stacked manner in one device-mounting area, without mounting the peripheral IC chip directly on the substrate. This makes it possible to reduce the substrate area. Further, this also makes it possible to bond the peripheral IC chip to the solid-state image pickup element, without newly applying an adhesive.

In one embodiment, after the step of curing the sealant, the process comprises the steps of:

mounting the transparent substrate on the printed circuit board by flip-chip bonding while inserting the solid-state image pickup element joined with the transparent substrate and the peripheral IC chip joined with the solid-state image pickup element in a through hole provided in the printed circuit board; and fitting the lens holder to the printed circuit board and a surface of the transparent substrate opposed to the surface to which the solid-state image pickup element using side surfaces of the transparent substrate as reference planes.

In this embodiment, while opposed to the light-receiving surface of the solid-state image pickup element via the transparent substrate, the image pickup element being joined faceup to the transparent substrate and sealed with the sealant, the lens holder is fitted to the transparent substrate and the printed circuit board, using the side surfaces of the transparent substrate as the reference planes. Therefore, unlike the conventional image pickup device, it is possible to assemble an image pickup device easily and highly accurately without using a highly accurate aligning technique.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
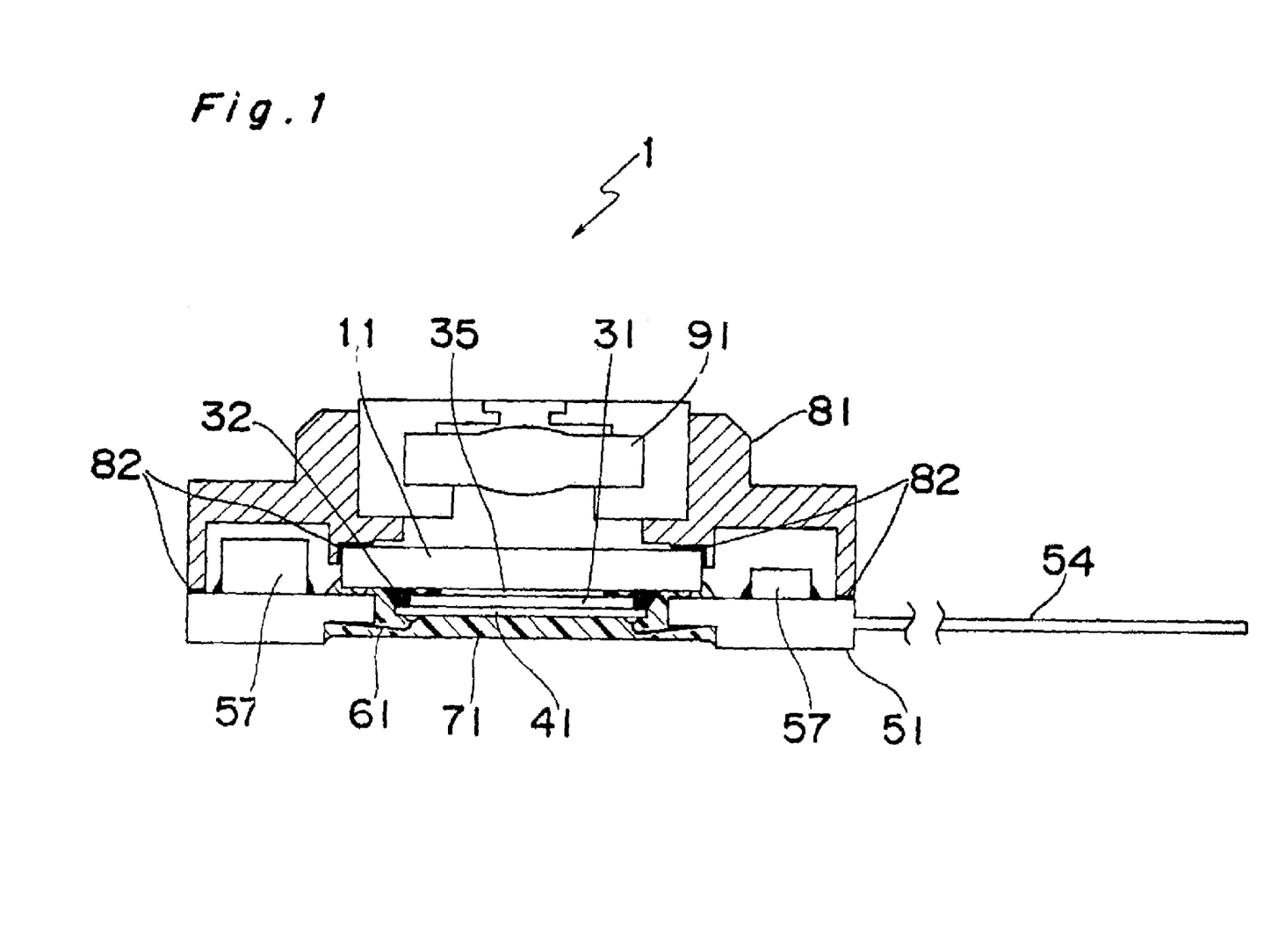
FIG. 1 is a schematic sectional view showing the constitution of an image pickup device according to an embodiment of the present invention.

FIG. 1 is a schematic sectional view showing the constitution of an image pickup device 1 according to an embodiment of the present invention. The image pickup device 1 has a transparent substrate 11, a solid-state image pickup element 31, a peripheral IC chip 41, a printed circuit board 51, a flexible printed circuit board lead ("FPC lead") 54, chip components 57, a lens holder 81 and a lens 91 that is an optical lens.

In the image pickup device 1, the solid-state image pickup element 31 is connected to a transparent substrate 11 by alloyed junction through bumps, with its light-receiving surface opposed to the transparent substrate 11 (i.e., faceup). An image of an object shot by the image pickup device 1 is formed on the solid-state image pickup element 31 through the lens 91 and the transparent substrate 11. The image pickup element 31 is sealed with a thermosetting resin 32 that is a first sealing material. The peripheral IC chip 41 such as a digital signal-processing IC that processes a signal outputted from the solid-state image pickup element 31 is bonded to and laid on the side of a rear surface of the solid-state image pickup element 31, opposite from the light-receiving surface, with the thermosetting resin 32. Further, with the image pickup element 31 and the peripheral IC chip 41 inserted into a through hole 52 provided with a countersink or spot-facing portion 53 (see FIG. 12B), which is formed in the printed circuit board 51, the transparent substrate 11 is connected to the printed circuit board 51 through Au wire bumps 24 (see FIG. 5A) that is a first metal material. In addition to that, lead electrodes provided on the spot-facing portion 53 in the printed circuit board 51 are wire-bonded to the peripheral IC chip 41 by wires 61. The wires 61, the solid-state image pickup element 31 and the peripheral IC chip 41 are sealed with a coat resin 71 that is a second sealing material. The lens holder 81 is attached to a rear surface of the transparent substrate 11 opposite from the surface to which the solid-state image pickup element 31 is joined, and is also attached to the printed circuit board 51 with an adhesive 82, using, as reference planes, side surfaces of the transparent substrate 11.

In the image pickup device 1 according to the present invention, the above constitution makes it possible to mount a plurality of devices in one device-mounting area in a stacked manner. Moreover, since the solid-state image pickup element 31 is doubly covered with the resins, its reliability is high. Further, the above constitution makes it possible to produce a small-size image pickup device that is easy in assembling, superior in mass productivity, highly functional and more reduced in size and thickness at a low cost. Furthermore, since a plurality of devices are stacked or laid on one another as mentioned above, it becomes possible to mount chip components, such as a resistor and a capacitor, only on one surface of the printed circuit board 51. This means that it becomes unnecessary to mount the chip components on a bottom surface of the image pickup device 1, resulting in easy handling of the image pickup device 1.

A process of assembling the image pickup device 1 will be hereinafter described in the order of process steps.

Figures 2A, 2B, 3:
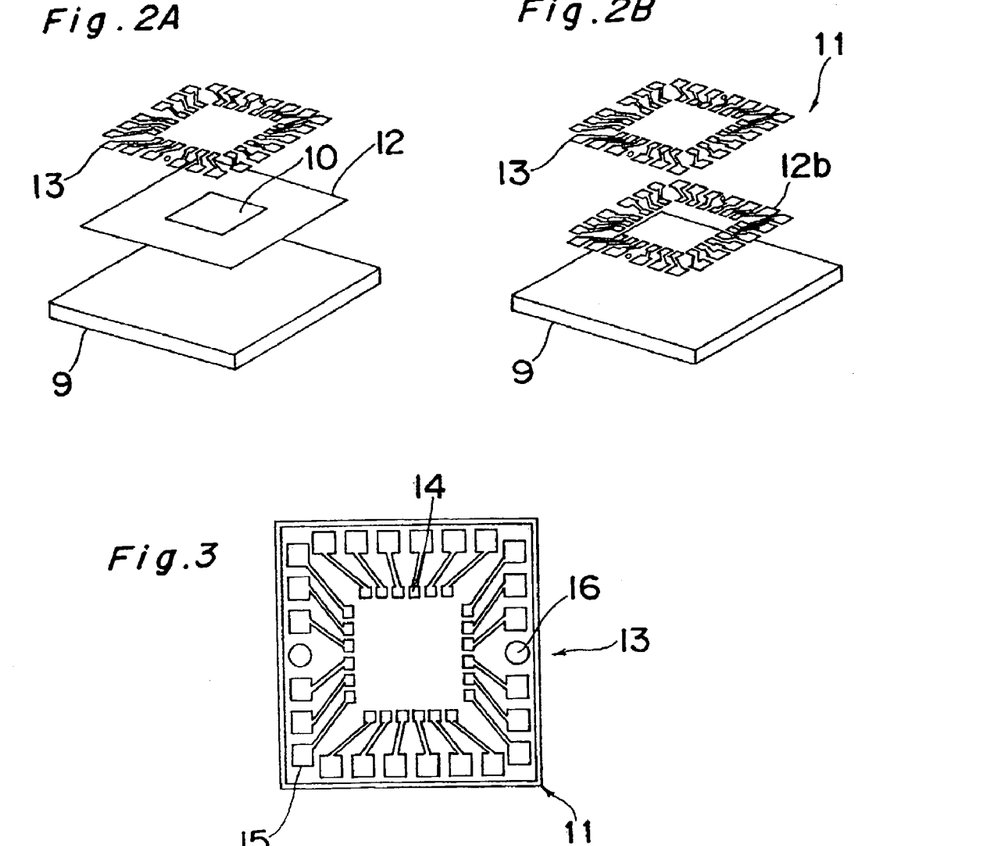
FIGS. 2A and 2B are exploded perspective views for explaining the wiring structure of a transparent substrate.
FIG. 3 is a plan view of the transparent substrate formed with the wirings.
Figure 4A:
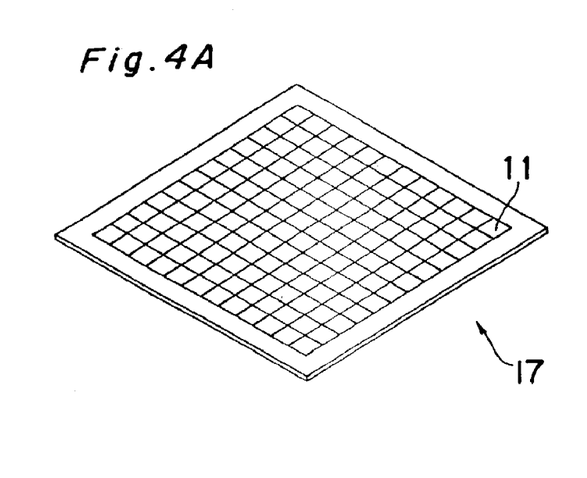
FIGS. 4A and 4B are perspective views showing large-size transparent substrates, of which external forms are individually different.
Figure 4B:
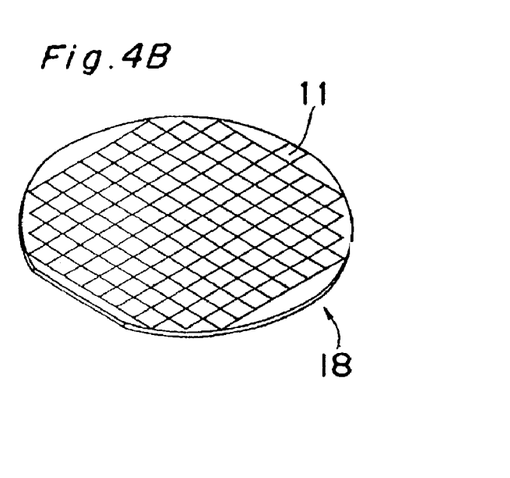

(1) FIGS. 2A and 2B are exploded perspective views for explaining the wiring structure of a transparent substrate. FIG. 3 is a plan view of the transparent substrate formed with the wirings. FIGS. 4A and 4B are perspective views of different large-size transparent substrates, showing the external forms thereof.

First, as shown in FIG. 2A, either a transparent plate 0.5 mm–0.7 mm thick and made of a visible light-transmitting material represented by glass and the like or the transparent plate subjected to optical filter treatment (hereinafter referred to as an optical filter) is prepared. Reference numeral 9 indicates the transparent plate or the optical filter. Then, an insulating film 12 such as an $SiO_2$ film is formed by CVD or sputtering on the transparent plate or the optical filter 9 in regions other than an area becoming a light-receiving region 10. Further, a metal material such as Al (aluminum) that is to become wirings on the insulating film 12 is formed to a thickness of 1000 nm–2000 nm by sputtering. The thus formed Al layer is etched to form wirings 13, whereby a transparent substrate 11 is fabricated.

In the transparent substrate 11, the reason why the wirings are formed in a two-layered structure is as follows: by providing the insulating film 12 between the wirings 13 formed of a metal material such as Al and the transparent plate or optical filter 9, the adhesion between the materials is enhanced to thereby secure alloy bond strength of solder bumps to be formed in the next process. Therefore, as long as a sufficient adhesion is attained, the layer of the insulating film that is to become the first layer of the two-layered structure may be replaced with a metal film 12b as an undercoat as shown in FIG. 2B. When the first layer consists of the metal film 12b serving as an undercoat, it is a matter of course that the metal film 12b requires to be patterned so as to have the same pattern as the wirings 13, namely, the second layer.

As shown in FIG. 3, the patterned wirings 13 consist of electrode terminals 14 for connection with the solid-state image pickup element (hereinafter "image pickup element connection electrode terminals 14", which are electric signal input/output terminals, external input/output electrode terminals 15, both of the terminals 14 and 15 being individually connected, and recognition marks 16 provided in the vicinity of the external input/output electrode terminals 15. The recognition marks 16 are used in several production process steps. That is, they are used for pattern recognition at the time of bump bonding in the production process of the image pickup device 1 described later, recognition at the time of facedown bonding process of the solid-state image pickup element 31, recognition at the time of die bonding of the peripheral IC chip 41 and at the time of flip chip bonding of the transparent substrate 11 onto the printed circuit board 51. Therefore, use of the recognition marks 16 in a fixed state makes it possible to enhance the mounting precision.

The above wirings 13 are arranged in a matrix manner on a large-size transparent substrate (hereinafter referred to as a transparent wafer) 17 having a quadrilateral shape or a transparent wafer 18 having a circular shape as shown in FIGS. 4A and 4B. The transparent wafers 17 and 18 are cut into a plurality of transparent substrates 11 in a dicing process described later.

(2) Bump Electrode Formation Process

Figure 5A:
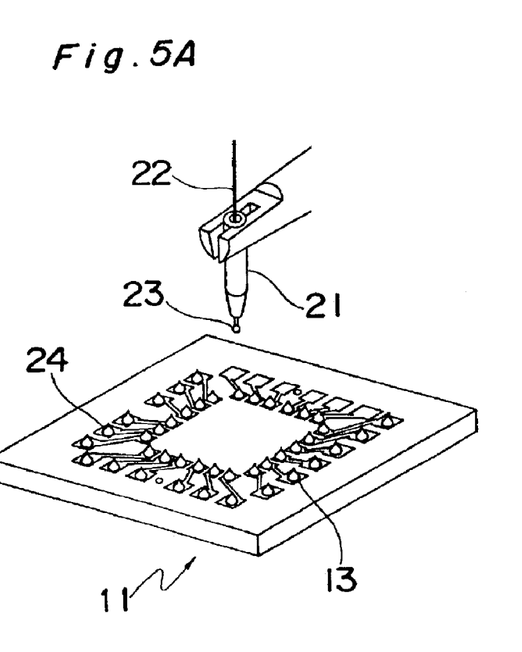
FIGS. 5A and 5B are a perspective view at the time of forming bump electrodes on the transparent substrate, and a side view of the transparent substrate provided with the bump electrodes, respectively.
Figure 5B:
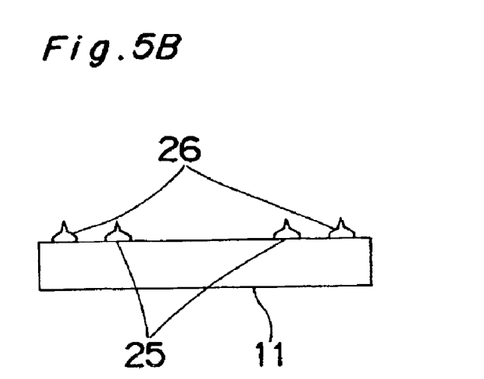

FIGS. 5A and 5B are a perspective view of the transparent substrate at the time of forming bump electrodes thereon and a side view of the transparent substrate provided with the bump electrodes, respectively.

As shown in FIG. 5A, Au balls 23 derived from an Au wire 22 are bonded to the image pickup element connection electrode terminals 14 and the external input/output electrode terminals 15 so as to form Au wire bumps (bump electrodes) 24. The Au wire bumps (hereinafter referred to as bumps) formed at this time are plastic-deformed when the solid-state image pickup element 31 is joined to the transparent substrate 11 with the bumps. For this reason, the bumps 24 are formed to have a height of at least 20 μm–30 μm, which is higher than the height of a microlens provided on a light-receiving surface 31f of the solid-state image pickup element 31, so that the microlens is not brought into contact with the transparent substrate 11. The bumps 24 consist of bumps 25 for the image pickup element connection electrode terminals and bumps 26 for the external input/output electrode terminals.

If the bumps 24 are formed on the solid-state image pickup element 31, handling of a capillary 21 and an ultrasonic hone will be performed at the light-receiving surface 31f of the solid-state image pickup element 31. Thus, there is a possibility that foreign matter adheres to the light-receiving region of the solid-state image pickup element 31. However, in the present invention, the bumps are formed on the side of the transparent substrate 11, which avoids the problem of the adhesion of the foreign matter to the light-receiving surface of the solid-state image pickup element 31. Further, there are less concave and convex portions on the surface of the transparent substrate 11, compared with the surface of the solid-state image pickup element 31. Therefore, even if the foreign matter adheres onto the transparent substrate 11, it is possible to eliminate the adhered foreign matter easily by washing.

(3) Image Pickup Element Joining Process

Figure 6:
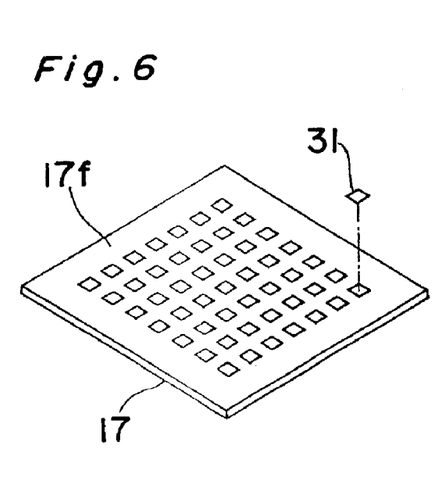
FIG. 6 is a perspective view of the transparent wafer on which the solid-state image pickup elements have been mounted.
Figure 7:
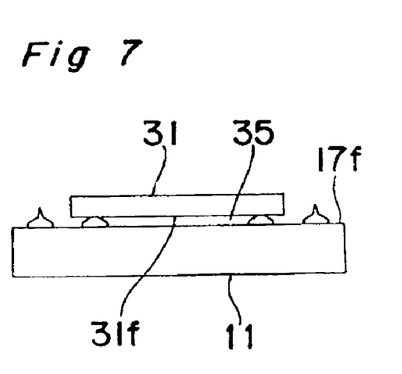
FIG. 7 is a side view of the transparent substrate on which the solid-state image pickup element has been mounted.

FIG. 6 is a perspective view of a transparent wafer on which the solid-state image pickup elements have been mounted. FIG. 7 is a side view of a transparent substrate on which a solid-state image pickup element has been mounted.

The solid-state image pickup elements 31 are placed on the bumps 24 formed on a transparent wafer 17. As shown in FIGS. 6 and 7, electrode terminals of the solid-state image pickup element 31 are brought into contact with the bumps 24, with a light-receiving surface 31f of the solid-state image pickup element 31 opposed to a bump-formed surface 17f of the transparent wafer 17 (facedown). At this time, since a predetermined gap 35 is formed between the tight-receiving surface 31f of the solid-state image pickup element 31 and the transparent substrate 11, a microlens provided on the light-receiving surface 31f of the solid-state image pickup element 31 is not brought into contact with the transparent substrate 11.

After that, the individual parts of the transparent wafer 17 to become the transparent substrates 11 are joined to the solid-state image pickup elements 31 through alloyed junctions. The reason why an ultrasonic bonding method is used for bonding the solid-state image pickup element 31 to the transparent substrate 11 is to achieve bonding at low temperatures and a significant throughput (high yield). That is, since the wirings on the transparent substrate side are formed from Al material having a high diffusion coefficient, it is possible to perform bonding at a low temperature of about 120° C. at the most. Further, only by the application of an ultrasonic wave, an alloy is formed to complete the bonding. Therefore, it is possible to attain significant throughput performance.

(4) Image Pickup Element Sealing Process

Figure 8:
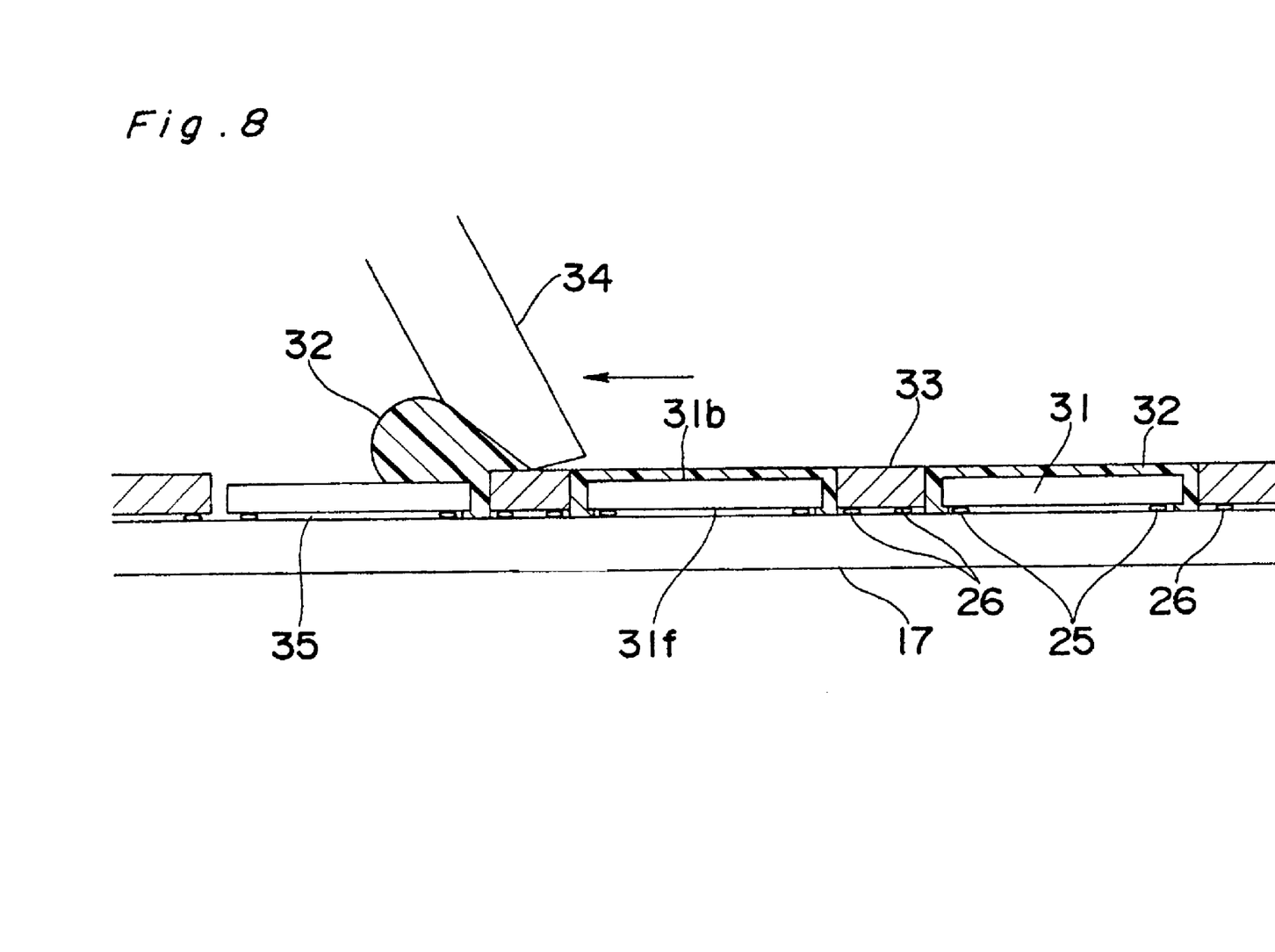
FIG. 8 is a side view showing a state where a resin is applied to the transparent wafer on which the solid-state image pickup elements have been mounted.

FIG. 8 is a side view showing a state where a resin is applied to the transparent wafer on which the solid-state image pickup elements have been mounted.

A thermosetting resin 32 is applied to side surfaces and rear surfaces 31b, opposite from the light-receiving surfaces, of the solid-state image pickup elements 31 so as to seal the solid-state image pickup elements 31. As shown in FIG. 8, in applying the thermosetting resin 32, a screen printing method is used in order to prevent the adhesion of the thermosetting resin 32 to the bumps 26 for the external input/output terminals formed on the transparent wafer 17. That is, a mask 33 having a predetermined shape is placed on the transparent substrate 17. Then, the thermosetting resin 32 is applied using a squeegee 34.

The objective of applying the thermosetting resin 32 to the side surfaces of the solid-state image pickup elements 31 is to prevent water containing swarf from entering the light-receiving regions (gaps 35) of the solid-state image pickup elements 31. Further, the objective of applying the thermosetting resin 32 to rear surfaces of the solid-state image pickup elements 31 is to use the thermosetting resin 32 as a die bond material in die bonding the peripheral IC chips 41.

Among the thermosetting resins, those resins having a high viscosity of about 200–300 Pa·s and having thixotropic properties are applicable as the thermosetting resin 32. Use of such thermosetting resins makes it possible to control the amount of the resin directed toward the gaps 35 between the solid-state image pickup elements 31 and the transparent wafer 17.

(5) Peripheral IC Mounting Process

Figures 9, 10:
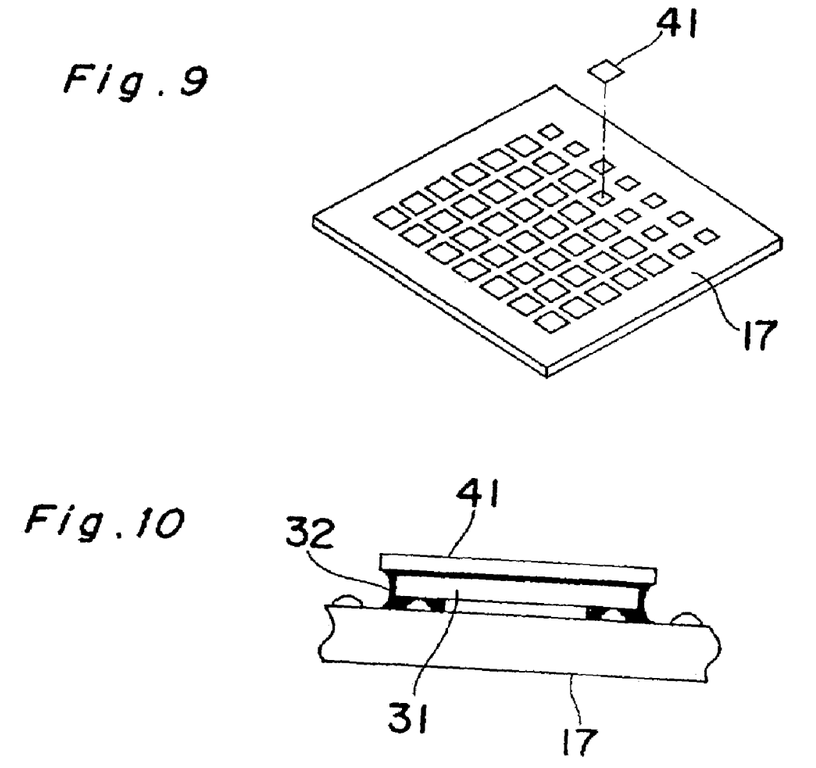
FIG. 9 is a perspective view of the transparent wafer on which the peripheral IC chips are being mounted.
FIG. 10 is a side view of the transparent substrate (wafer) with a peripheral IC chip mounted on a solid-state image pickup element.

FIG. 9 is a perspective view of the transparent wafer on which the peripheral IC chips are being mounted. FIG. 10 is a side view of a part (corresponding to one transparent substrate) of the solid-state image pickup element-mounted transparent wafer, on which the peripheral IC chip has been mounted.

Subsequently, peripheral IC chips 41, such as digital signal processing ICs, are die bonded (mounted) faceup onto the rear surfaces (opposite from the light-receiving surfaces) of the solid-state image pickup elements 31 to which the thermosetting resin 32 has been applied. After that, the thermosetting resin 32 is cured so that the IC chips 41 are joined with the respective associated solid-state image pickup elements 31. Since the thermosetting resin 32 applied to the solid-state image pickup elements 31 in the preceding process is now used as the die bond material, the thermosetting resin 32 after the die bonding becomes configured so as to fix the rear surfaces of the peripheral IC chips 41, while covering the peripheries of the solid-state image pickup elements 31 Although FIG. 10 shows, as an example, a case where the size of the peripheral IC chip 41 is larger than that of the solid-state image pickup element 31, there is no problems even if the size of the peripheral IC chip 41 is smaller than that of the solid-state image pickup element 31.

Figure 11:
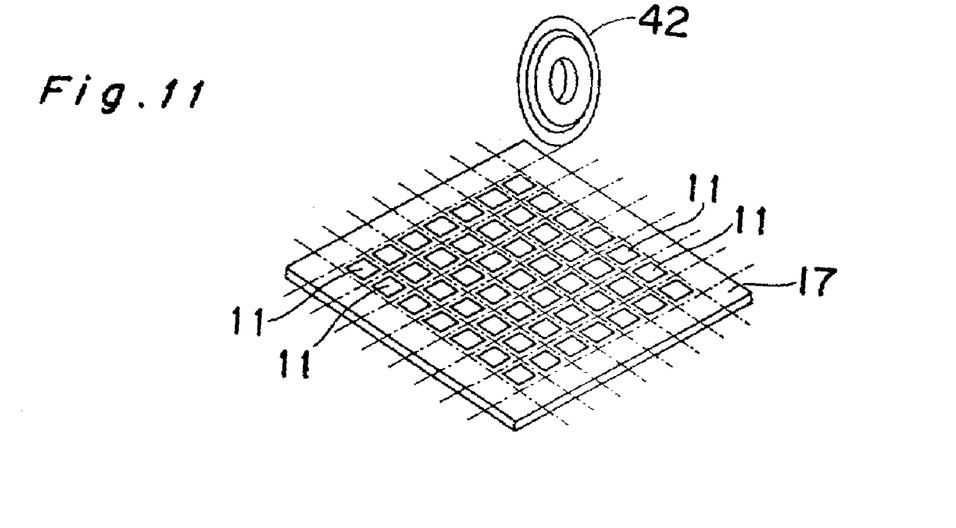
FIG. 11 is a perspective view showing a state where the transparent wafer is subjected to dicing.

(6) FIG. 11 is a perspective view showing a state where the transparent wafer 17 is subjected to dicing As shown in FIG. 11, the transparent wafer 17, wherein mounting of the solid-state image pickup elements 31 and peripheral IC chips 41 has been completed in the preceding process, is cut into separate transparent substrates 11 using a dicing blade 42.

Figure 12A:
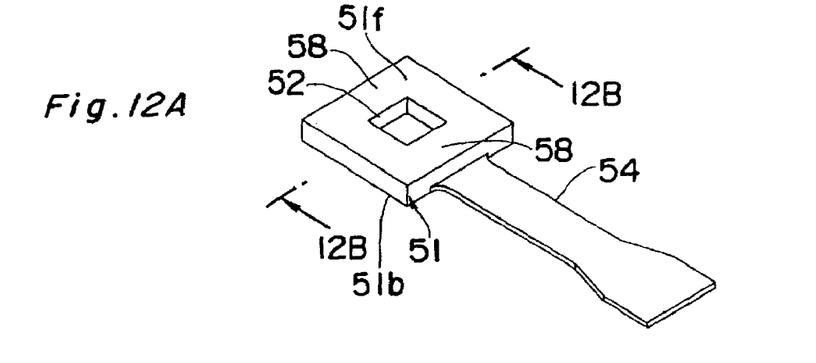
FIGS. 12A and 12B are a schematic perspective view of a printed circuit board, and a sectional view taken along line 12B—12B of FIG. 12A, respectively.
Figure 12B:
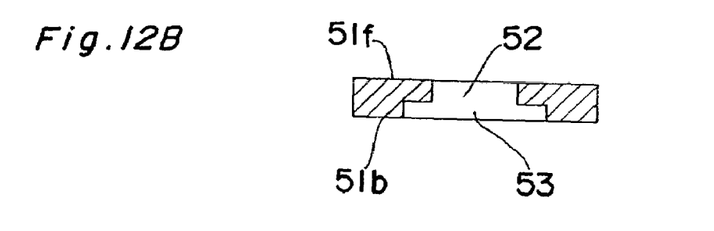
Figure 13:
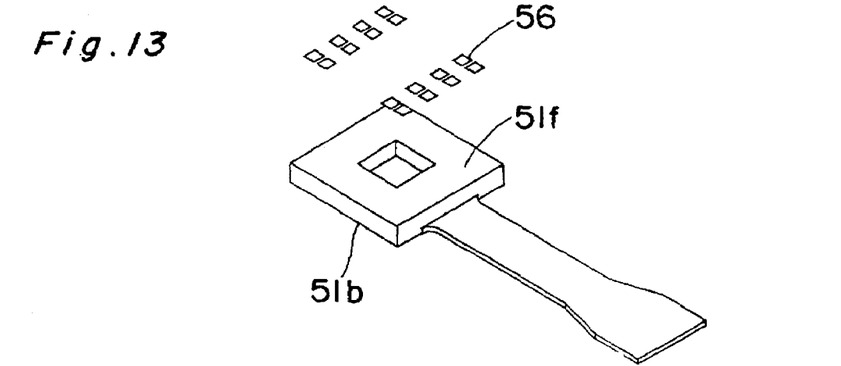
FIG. 13 is a perspective view showing positions on the printed circuit board where a soldering paste is applied.
Figure 14:
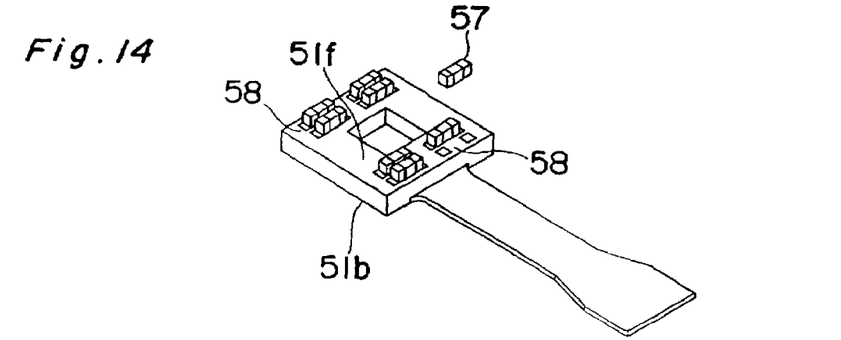
FIG. 14 is a perspective view showing a state where chip components are being mounted on the printed circuit board.

(7) FIG. 12A is a schematic perspective view of a printed circuit board, and FIG. 12B is a sectional view of the printed circuit board taken along line 12B—12B of FIG. 12A. FIG. 13 is a perspective view showing positions on the printed circuit board where a soldering paste is applied. FIG. 14 is a perspective view showing a state where chip components are being mounted on the printed circuit board.

As shown in FIGS. 12A, 12B and FIG. 13, a printed circuit board 51 is prepared, which board 51 has a through hole 52 formed therethrough from its top surface 51f to its rear surface 51b, with a spot-facing portion 53 formed at the rear surface side. The front surface 51f of this printed circuit board 51 is provided with a land for connecting the transparent substrate 11 and lands 58 for mounting chip components such as a resistor and a capacitor. Further, on the side of the rear surface 51b of the printed circuit board 51, there are provided lead electrodes (terminals) at the spot-facing portion 53 for connecting with the peripheral IC chip 41 through bonding wires.

Although not depicted, the printed circuit board 51 may be formed by bonding a hard substrate having a through hole of a predetermined opening area and an FPC having a through hole of a larger opening area together such that the thus formed printed circuit board 51 has a desired cross sectional shape for providing the spot-facing portion 53. Alternatively, the printed circuit board 51 may be formed by bonding an FPC having a through hole of a predetermined opening area and a hard substrate having a through hole of a larger opening area together.

As shown in FIG. 13, a solder paste 56 is applied by a screen printing technique to the front surface 51*f* of the printed circuit board 51 at the lands 58 where chip components 57 such as a resistor and a capacitor are to be mounted. Then, after mounting the chip components 57 on the lands 58 as shown in FIG. 14, reflowing is performed.

(8) Flip Chip Bonding Process

Figure 15:
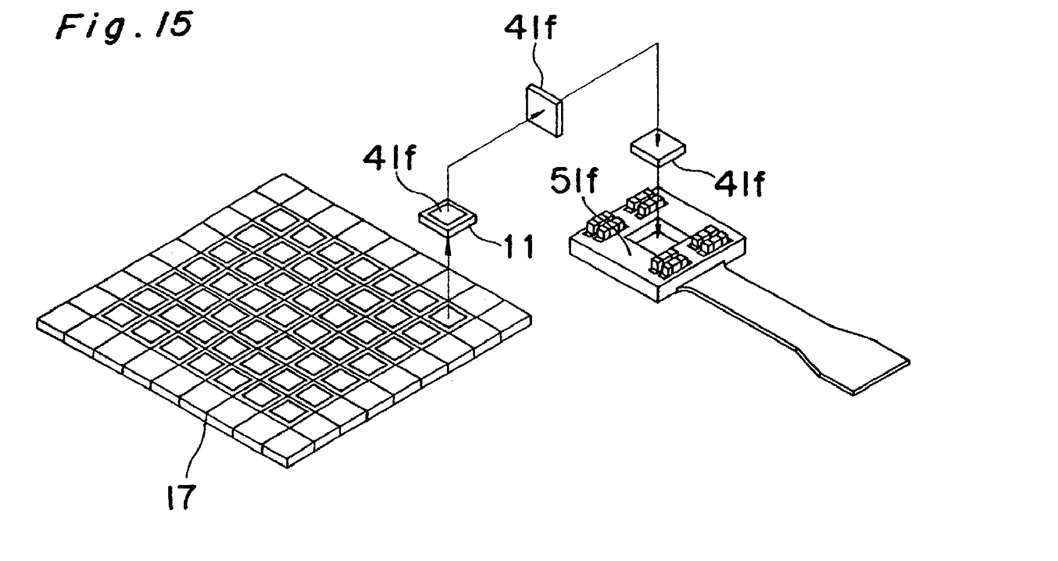
FIG. 15 is a perspective view showing a state where a transparent substrate is mounted on the printed circuit board by flip chip bonding.
Figure 16:
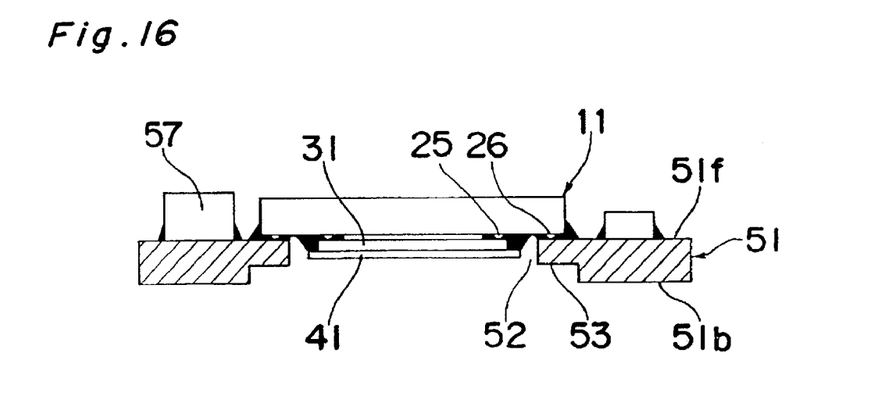
FIG. 16 is a sectional view of the printed circuit board on which a transparent substrate has been mounted by flip chip bonding.

FIG. 15 is a perspective view showing a state where a transparent substrate is mounted on a printed circuit board by flip chip bonding. FIG. 16 is a sectional view of the printed circuit board on which the transparent substrate has been mounted.

As shown in FIG. 15, a transparent substrate 11, on which the solid state image pickup element 31 and the peripheral IC chip 41 have been mounted, is picked up among the transparent substrates 11 into which the transparent wafer has been cut in the dicing process described in the item (6) above. Then, the picked up transparent substrate 11 is mounted by the flip chip bonding technique on the surface 51*f* of the printed circuit board 51 having the chip components mounted in the preceding process. In order to bond the transparent substrate 11 and the printed circuit board 51 together as shown in FIG. 16, both ACP (anisotropic conductive paste) bonding and an ultrasonic bonding method may be used as the bonding method. However, if the ultrasonic bonding method is used, it is required to inject an underfill into a gap between the transparent substrate 11 and the printed circuit board 51.

In the present process, the solid-state image pickup element 31 that was mounted facedown turns into a state where the element 31 is mounted faceup, while the peripheral IC chip 41 that was mounted faceup turns into a state where the IC chip 41 is mounted facedown.

Figure 17:
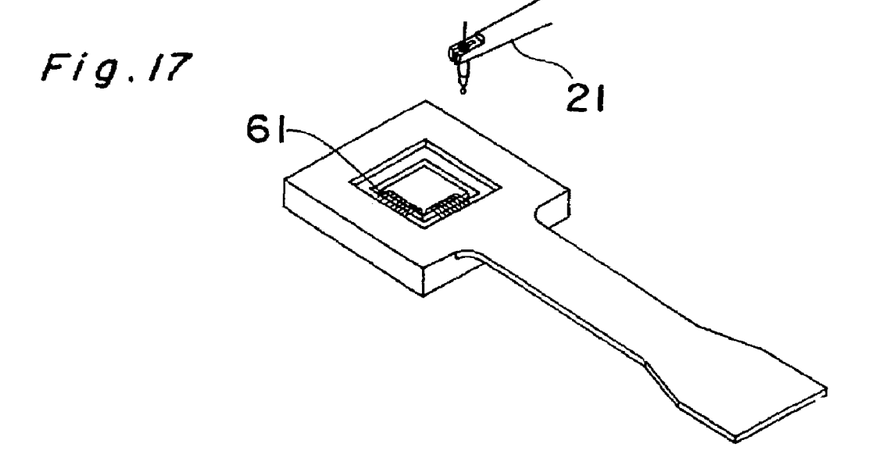
FIG. 17 is a perspective view showing a state where the peripheral IC chip is being subjected to wire bonding.
Figure 18:
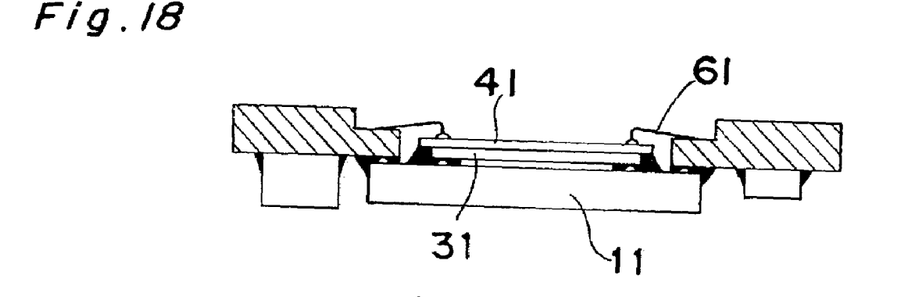
FIG. 18 is a sectional view of the transparent substrate and the printed circuit board that have been wire bonded.

(9) FIG. 17 is a perspective view showing a state where the peripheral IC chip is being wire bonded. FIG. 18 is a sectional view of the transparent substrate and the printed circuit board that have been wire bonded.

Upon inverting the printed circuit board 51 on which the transparent substrate 11 was mounted in the first half process, the mounted peripheral IC chip 41 is directed upwards face up in the spot-facing portion 53 as shown in FIG. 17. In this state, the electrode terminals of the peripheral IC chip 41 are connected to the lead terminals provided at the spot-facing portion 53 through wires 61 by the wire bonding technique, resulting in a state shown in FIG. 18.

Figure 19:
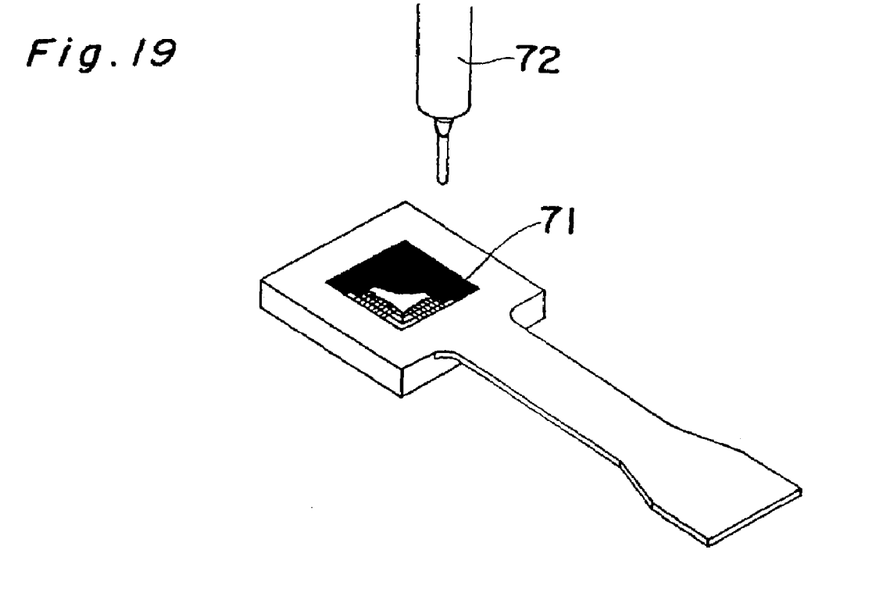
FIG. 19 is a perspective view showing a state where a coat resin is applied to a peripheral IC.
Figure 20:
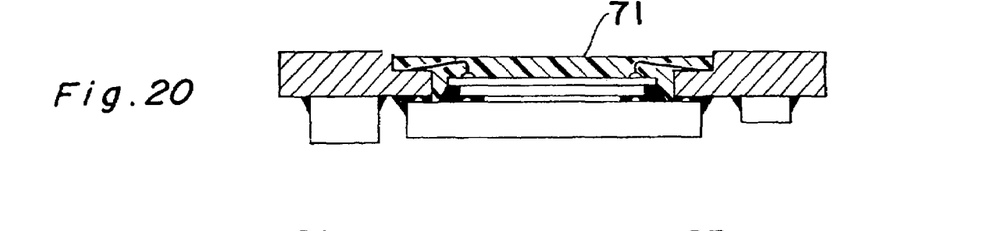
FIG. 20 is a sectional view of the transparent substrate and the printed circuit board to which the coat resin has been applied.

(10) FIG. 19 is a perspective view showing a state where a coat resin is applied to the peripheral IC chip. FIG. 20 is a sectional view of the transparent substrate and the printed circuit board to which the coat resin has been applied.

Subsequently, as shown in FIG. 19, a coat resin 71 is applied to the connected peripheral IC chip 41 with a dispenser 72 and then cured. By using a resin having a relatively low viscosity and good fluidity as the coat resin 71, the coat resin 71 is directed also toward the periphery of the solid-state image pickup element 31 so as to doubly cover the element, which makes it possible to achieve highly reliable hermetic sealing. Further, the through hole 52 has the spot-facing portion 53. Thus, even if a resin having a low viscosity is used, side surfaces defining the spot-facing portion 53 serve as a dam (floodwall) to prevent the resin from flowing out. Thus, even if the coat resin in a large amount is applied, the coat resin never flows out of the spot-facing portion 53 as shown in FIG. 20.

(11) Lens Holder Fitting Process

Figure 21:
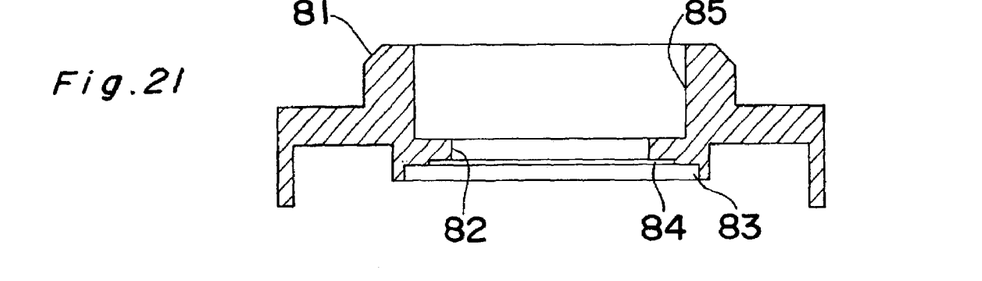
FIG. 21 is a sectional view of a lens holder.
Figure 22:
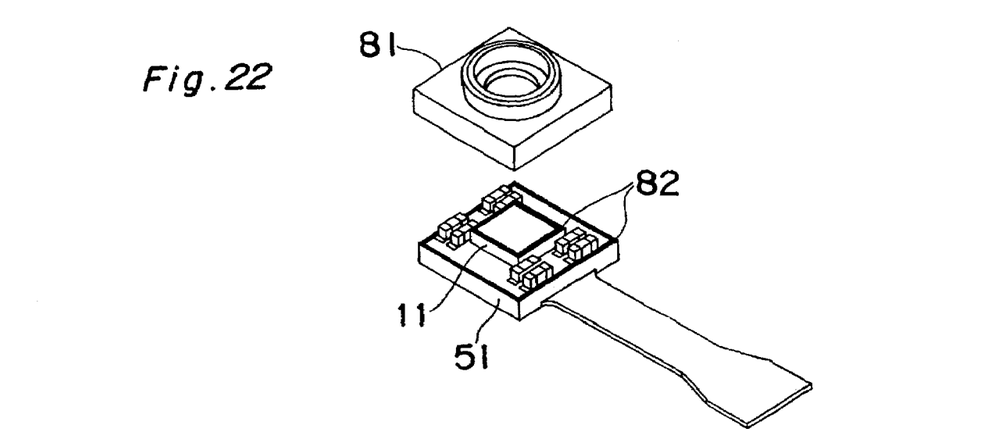
FIG. 22 is a perspective view showing a state where the lens holder is in process of being fitted to the transparent substrate and the printed circuit board.

FIG. 21 is a sectional view of a lens holder. FIG. 22 is a perspective view showing a state where the lens holder is in process of being fitted to the transparent substrate and the printed circuit board.

A lens holder 81 as shown in FIG. 21 is prepared. The lens holder 81 has a through hole 82, with its upper side forming an insertion hole 85 and its lower side forming spot-facing portions 83 and 84 which take a two-step shape.

The spot-facing portion 83 (a first step) is intended to achieve highly precise fitting of the lens holder 81. Namely, the lens holder 81 is fitted such that the transparent substrate 11 is fitted into the spot-facing portion 83 by using the side surfaces of the transparent substrate 11 as reference planes. The spot-facing portion 84 (a second step) serves as an escape of the adhesive 82.

As shown in FIG. 22, the lens holder 81 is placed in position and fixed to the transparent substrate 11 and the printed circuit board 51, to both of which the adhesive has been applied at the peripheral.

Figure 23:
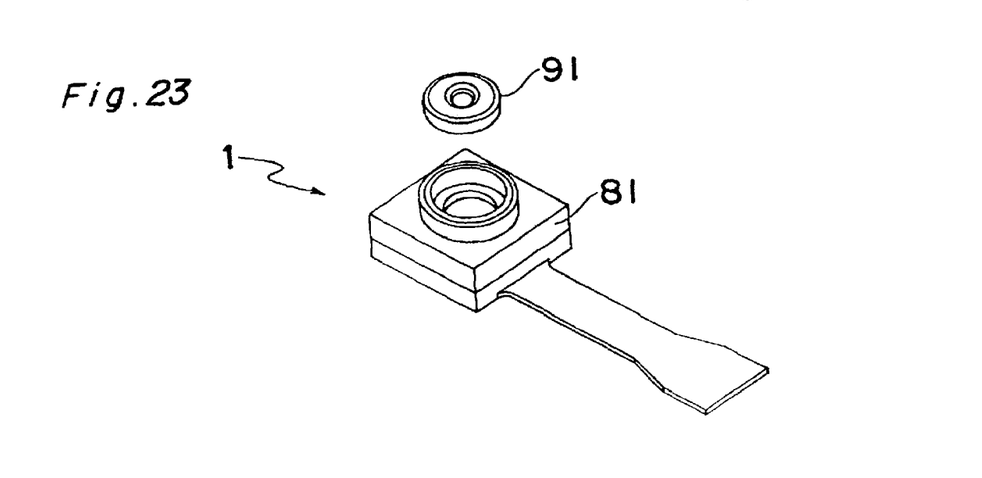
FIG. 23 is a perspective view showing a state where a lens is in process of being fitted to the lens holder.

(12) FIG. 23 is a perspective view showing a state where a lens is in process of being fitted to the lens holder.

Lastly, fitting a lens 91 to the lens holder 81 as shown in FIG. 23 completes the image pickup device 1. What is described above is a basic process for producing the image pickup device 1.

Figure 24:
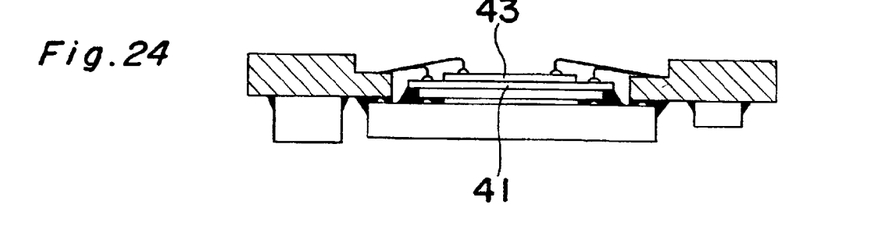
FIG. 24 is a perspective view showing a state where another peripheral IC chip has been mounted on the peripheral IC chip in the same orientation.
Figures 25, 26:
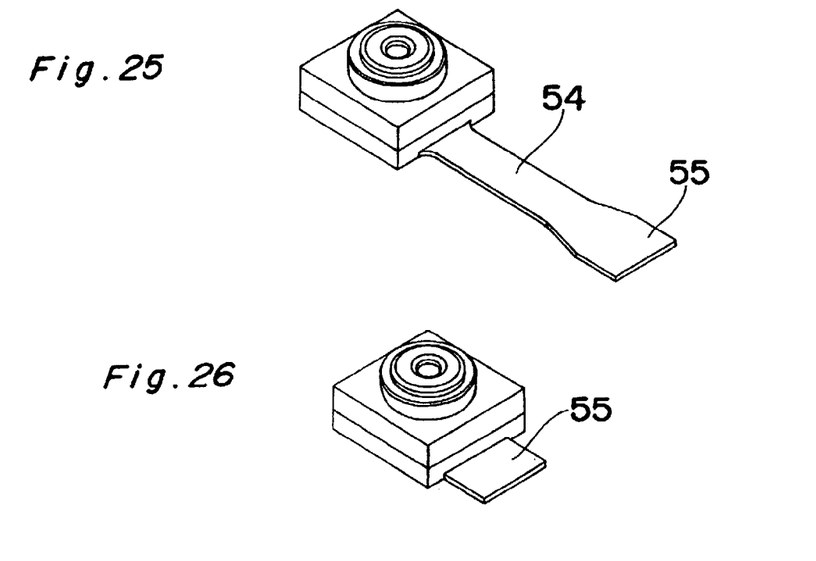
FIG. 25 is a perspective view showing an outer appearance of an image pickup device equipped with a straight-type FPC lead.
FIG. 26 is a perspective view showing an outer appearance of an image pickup device equipped with an FPC lead consisting of only input/output terminals.
Figure 27:
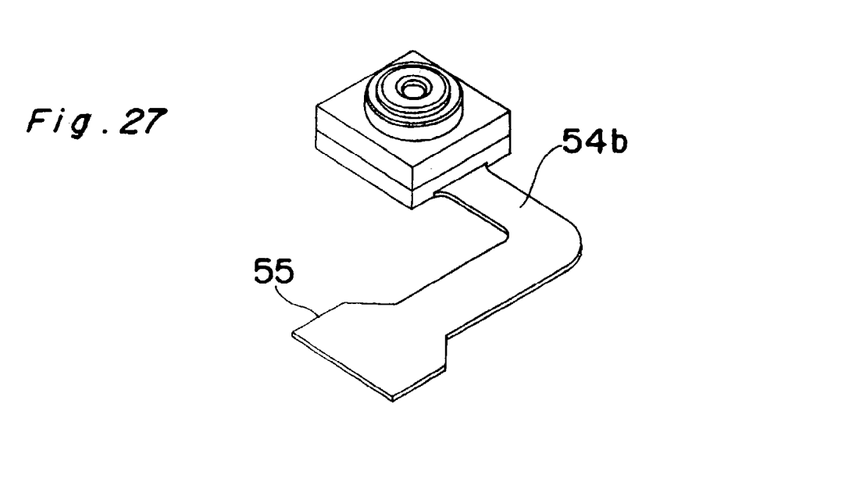
FIG. 27 is a perspective view showing an outer appearance of an image pickup device equipped with an FPC lead having a bend.

FIG. 24 is a perspective view showing a state where a peripheral IC chip 41 is additionally laid on the peripheral IC chip 43 in the same orientation. FIG. 25 is a perspective view showing an outer appearance of an image pickup device equipped with a straight-type FPC lead. FIG. 26 is a perspective view showing an outer appearance of an image pickup device equipped with an FPC lead consisting of only input/output terminals. FIG. 27 is a perspective view showing an outer appearance of an image pickup device equipped with an FPC lead having a bend.

The above-described embodiment refers to the single-chip mounting wherein the peripheral IC chip 41 is bonded to the solid-state image pickup element back to back. However, it is also possible to mount an additional peripheral IC chip 43 on the peripheral IC chip 41 such that they are oriented in the same direction as shown in FIG. 24. With this constitution, even if the number of components of the image pickup device 1 increases to make it highly functional, it is not required that the size of the image pickup device 1 be increased.

Further, by changing the shape of the FPC lead portion 54 serving as the input/output lead, it is possible to cope with various types of image pickup devices, e.g., an image pickup device fitted with a straight-type FPC lead as shown in FIG. 25, an image pickup device fitted with an FPC lead having only an input-output terminal portion 55 as shown in FIG. 26, an image pickup device fitted with an FPC lead provided with a bend 54*b* as shown in FIG. 27, and the like.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An image pickup device, comprising:
   a solid-state image pickup element having light-receiving surface;
   a peripheral IC chip processing a signal output from the solid-state image pickup device;
   a lens holder to which an optical lens is fittable;

a printed circuit board to which the lens holder is fixed, the printed circuit board being provided with a through hole; and a transparent substrate made of a material that transmits visible light or a material that has been subjected to optical filter treatment and is capable of transmitting visible light, said transparent substrate having wirings on at least a surface thereof, the wirings of the transparent substrate that are joined to the solid-state image pickup element are connected to the printed circuit board through a first metal material in a state where the solid-state image pickup element joined to the transparent substrate are received in the through hole of the printed circuit board;

said image pickup element being sealed with a sealant in a state where the solid-state image pickup element is joined to the wirings on the surface of the transparent substrate, with the light-receiving surface of the solid-state pickup element opposed to the transparent substrate leaving predetermined gap therebetween, and the lens holder being fitted to a surface of the transparent substrate opposite from said surface to which the solid-state image pickup element is joined.

2. The image pickup device according to claim 1, wherein the peripheral IC chip is bonded to a rear surface of the solid-state image pickup element opposite from the light-receiving surface with the first sealant.

3. The image pickup device according to claim 2, wherein the peripheral IC chip is connected to the printed circuit board through a second metal material; and the solid-state image pickup element, the peripheral IC chip and the second metal material, which are received in the through hole of the printed circuit board, are sealed with a second sealant.

4. The image pickup device according to claim 1, wherein the wirings of the transparent substrate are two layer-structured wirings which comprise either an insulating layer or an undercoat metal layer formed on said surface except for a region corresponding to a light-receiving region of the solid image pickup device, and a third metal material layer on the insulating layer or the undercoat metal layer.

5. The image pickup device according to claim 1, wherein the wirings of the transparent substrate include electrode terminals for connection with the solid-state image pickup element, external input/output electrode terminals provided in proximity to a perimeter of the transparent substrate, and recognition marks for positioning which are provided in proximity to the external input/output electrode terminals.

6. The image pickup device according to claim 3, wherein the printed circuit board has a spot-facing portion around the through hole on its rear surface which is opposite from the surface at which the printed circuit board is connected to the wirings of the transparent substrate, and the spot-facing portion is provided with terminals to which the second metal material is connected.

7. The image pickup device according to claim 6, wherein the printed circuit board comprises a hard substrate and a flexible board bonded together, each of which has a through hole, and the through holes of the hard substrate and the flexible board have different opening areas such that the spot-facing portion is provided.

8. The image pickup device according to claim 1, wherein the lens holder has a two-stepped spot-facing portion at a surface at which the lens holder is fitted to the transparent substrate, and the lens holder is joined to the printed circuit board and the transparent substrate with an adhesive.

9. An image pickup device, comprising:
a solid-state image pickup element having light-receiving surface;
a peripheral IC chip processing a signal output from the solid-state image pickup device;
a lens holder to which an optical lens is fittable;
a printed circuit hoard to which the lens holder is fixed;
a transparent substrate made of a material that transmits visible light or a material that has been subjected to optical filter treatment and is capable of transmitting visible light, said transparent substrate having wirings on at least a surface thereof,
said image pickup element being sealed with a sealant in a state where the solid-state image pickup element is joined to the wirings on the surface of the transparent substrate with the light-receiving surface of the solid-state pickup element opposed to the transparent substrate leaving predetermined gap therebetween;
the lens holder being fitted to a surface of the transparent substrate opposite from said surface to which the solid-state image pickup element is joined;
wherein the lens holder has a two-stepped spot-facing portion at a surface at which the lens holder is fitted to the transparent substrate and the lens holder is joined to the printed circuit board and the transparent substrate with an adhesive; and
wherein the lens holder is fitted to the transparent substrate and the printed circuit board, using side surfaces of the transparent substrate as reference planes.

10. An image pickup device, comprising:
a solid-state image pickup element having light-receiving surface:
a peripheral IC chip processing a signal output from the solid-state image pickup device;
a lens holder to which an optical lens is fittable;
a printed circuit hoard to which the lens holder is fixed;
a transparent substrate made of a material that transmits visible light or a material that has been subjected to optical filter treatment and is capable of transmitting visible light, said transparent substrate having wirings on at least a surface thereof,
said image pickup element being sealed with a sealant in a state where the solid-state image pickup element is joined to the wirings on the surface of the transparent substrate with the light-receiving surface of the solid-state pickup element opposed to the transparent substrate leaving predetermined gap therebetween;
the lens holder being fitted to a surface of the transparent substrate opposite from said surface to which the solid-state image pickup element is joined;
wherein the peripheral IC chip is bonded to a rear surface of the solid-state image pickup element opposite from the light-receiving surface with the first sealant; and
wherein the peripheral IC chip is capable of carrying another peripheral IC chip on a surface opposite from the surface bonded to the solid-state image pickup element.

* * * * *